(12) United States Patent
Finney et al.

(10) Patent No.: US 12,021,139 B2
(45) Date of Patent: Jun. 25, 2024

(54) SEMICONDUCTOR ARRANGEMENT WITH AN INTEGRATED TEMPERATURE SENSOR

(71) Applicant: Infineon Technologies AG, Neubiberg (DE)

(72) Inventors: Adrian Finney, Villach (AT); Norbert Krischke, Munich (DE); Mathias Racki, Hilgertshausen-Tandern (DE)

(73) Assignee: Infineon Technologies AG, Neubiberg (DE)

(*) Notice: Subject to any disclaimer, the term of this patent is extended or adjusted under 35 U.S.C. 154(b) by 660 days.

(21) Appl. No.: 17/121,008

(22) Filed: Dec. 14, 2020

(65) Prior Publication Data

US 2021/0193827 A1  Jun. 24, 2021

(30) Foreign Application Priority Data

Dec. 20, 2019 (DE) .............. 102019135495

(51) Int. Cl.
*G01K 7/01* (2006.01)
*H01L 27/06* (2006.01)
(Continued)

(52) U.S. Cl.
CPC ............ *H01L 29/7803* (2013.01); *G01K 7/01* (2013.01); *H01L 27/0623* (2013.01);
(Continued)

(58) Field of Classification Search
CPC ............ H01L 29/7803; H01L 27/0623; H01L 29/66272; H01L 29/7304; H01L 29/732; H01L 23/34; H01L 27/0716; H01L 27/0772; H01L 21/8222; H01L 21/8248; H01L 21/8249; H01L 27/0259;
(Continued)

(56) References Cited

U.S. PATENT DOCUMENTS

| 2003/0107051 A1* | 6/2003 | Park | H01L 29/66242 |
| | | | 257/E29.193 |
| 2019/0165097 A1* | 5/2019 | Fukunaga | H01L 29/7813 |
| 2020/0227406 A1* | 7/2020 | Murakawa | H01L 27/0727 |

FOREIGN PATENT DOCUMENTS

| DE | 102004024887 A1 | 12/2005 |
| DE | 102004047752 B3 | 1/2006 |
| DE | 102004063946 A1 | 3/2006 |

* cited by examiner

*Primary Examiner* — Mohammad A Rahman
(74) *Attorney, Agent, or Firm* — Murphy, Bilak & Homiller, PLLC

(57) ABSTRACT

A semiconductor arrangement is disclosed. The semiconductor arrangement includes: a semiconductor body and a temperature sensor (TES) integrated in the semiconductor body. The TES includes: a first semiconductor region of a first doping type arranged, in a vertical direction of the semiconductor body, between a second semiconductor region of a second doping type and a third semiconductor of the second doping type, and a contact plug ohmically connecting the first semiconductor region and the second semiconductor region. The first semiconductor region includes a base region section spaced apart from the contact plug in a first lateral direction of the semiconductor body and a resistor section arranged between the base region section and the contact plug. The resistor section is implemented such that an ohmic resistance of the resistor section between the base region section and the first semiconductor region is at least 1 MΩ.

23 Claims, 7 Drawing Sheets

(51) Int. Cl.
*H01L 29/66* (2006.01)
*H01L 29/73* (2006.01)
*H01L 29/732* (2006.01)
*H01L 29/78* (2006.01)

(52) U.S. Cl.
CPC .... *H01L 29/66272* (2013.01); *H01L 29/7304* (2013.01); *H01L 29/732* (2013.01)

(58) Field of Classification Search
CPC ............ H01L 27/0262; H01L 27/0635; H01L 27/0647; H01L 27/067; H01L 27/0711; H01L 27/0722; H01L 27/0629; H01L 29/0634; H01L 29/7813; H01L 29/7397; H01L 29/1095; H01L 29/407; G01K 7/01; G01K 7/015
See application file for complete search history.

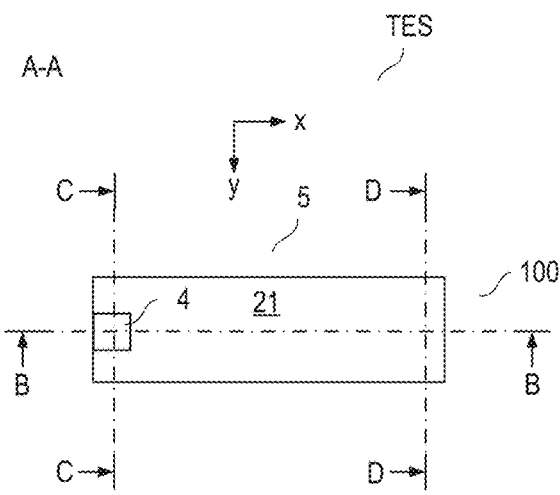
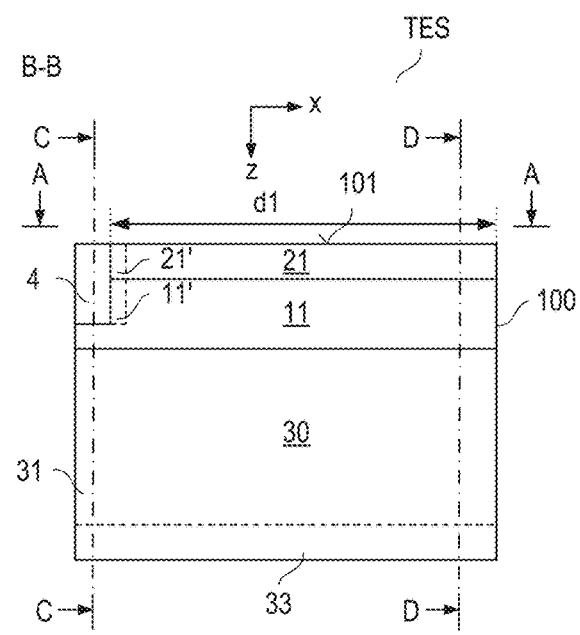
FIG 1A
FIG 1B
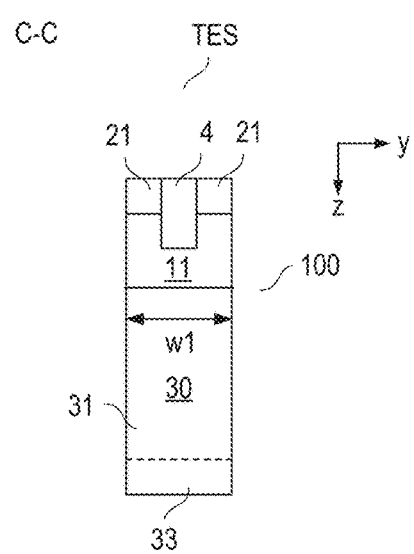
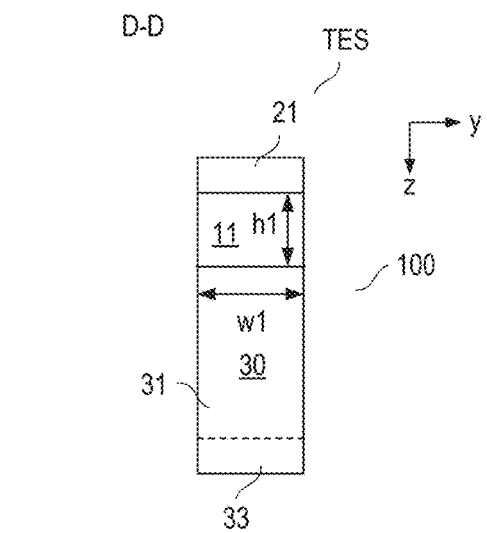
FIG 1C
FIG 1D

SEMICONDUCTOR ARRANGEMENT WITH AN INTEGRATED TEMPERATURE SENSOR

TECHNICAL FIELD

This disclosure in general relates to a semiconductor arrangement that includes a temperature sensor integrated in a semiconductor body.

BACKGROUND

In various kinds of semiconductor arrangements, it is desired to measure the temperature inside a semiconductor body. One example of such semiconductor arrangement is a power transistor. A power transistor includes a plurality of transistor cells that are integrated in semiconductor body. A power transistor may be operated in an on-state and an off-state, wherein in the on-state power may be dissipated in the semiconductor body so that the semiconductor body is heated up. A temperature sensor integrated in the semiconductor body is useful to detect an overtemperature so that the power transistor can be switched off in order to protect the power transistor from being damaged or destroyed.

There is a need for a space saving integrated temperature sensor, in particular a temperature sensor that may be implemented in a power transistor and can be produced in a cost-efficient way.

SUMMARY

One example relates to a semiconductor arrangement with a semiconductor body and a temperature sensor integrated in the semiconductor body. The temperature sensor includes a first semiconductor region of a first doping type arranged, in a vertical direction of the semiconductor body, between a second semiconductor region of a second doping type and a third semiconductor region of the second doping type, and a contact plug ohmically connecting the first semiconductor region and the second semiconductor region. The first semiconductor region includes a base region section spaced apart from the contact plug in a first lateral direction of the semiconductor body and a resistor section arranged between the base region section and the contact plug. The resistor section is implemented such that an ohmic resistance of the resistor section between the base region section and the contact plug is at least 1 MΩ.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 1A-1D show a top view and vertical cross-sectional views, respectively, of a temperature sensor according to one example;

DETAILED DESCRIPTION

Figure 2:
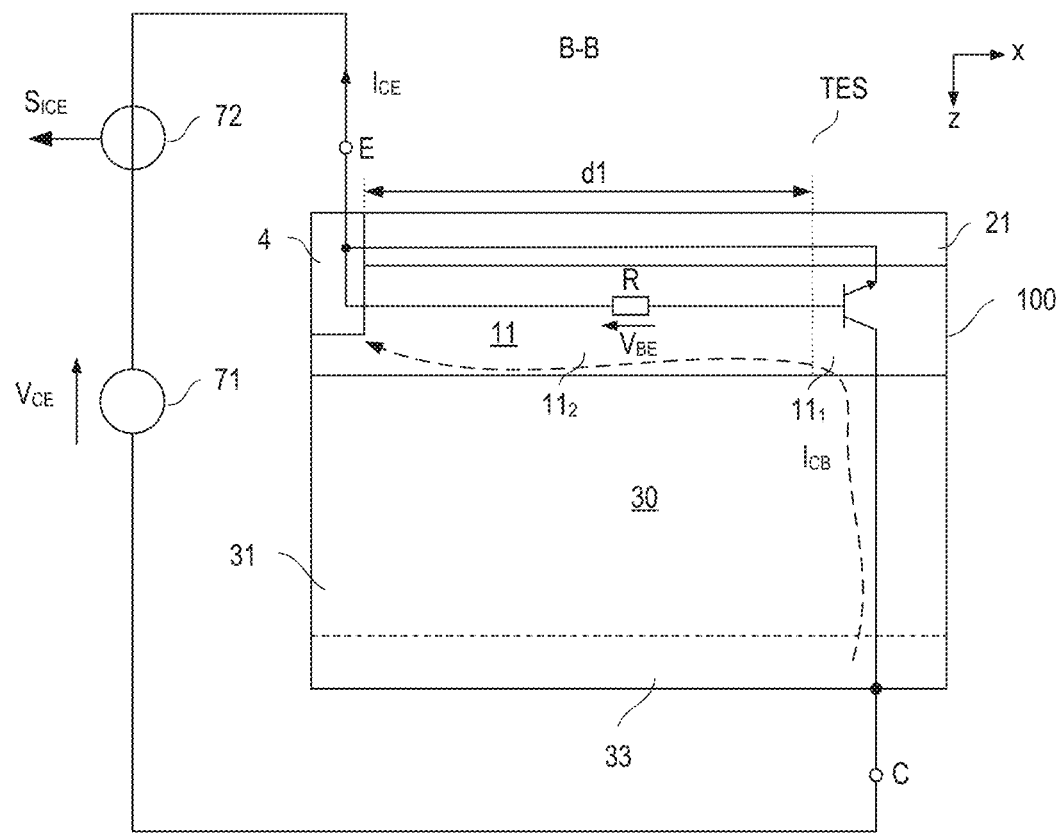
FIG. 2 illustrates the function of the temperature sensor according to FIGS. 1A-1D.

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

FIGS. 1A-1D illustrate one example of a temperature sensor TES integrated in a semiconductor body 100, wherein only a section of the semiconductor body 100 in which the temperature sensor TES is integrated is illustrated. FIG. 1A illustrates a top view on a first surface 101 of the semiconductor body 100, FIG. 1B illustrates a vertical cross-sectional view of the semiconductor body 100 in a first vertical section plane B-B, FIG. 1C illustrates a vertical cross-sectional view of the semiconductor body 100 in a second vertical section plane C-C, and FIG. 1D illustrates a vertical cross-sectional view of the semiconductor body 100 in a third vertical section plane D-D. The first vertical section plane B-B extends in a vertical direction z and a first lateral direction x of the semiconductor body 100, the second vertical section plane C-C extends in the vertical direction z and a second lateral direction y, and the third vertical section plane D-D extends in the vertical direction z and the second lateral direction y. The second lateral direction y is perpendicular to the first lateral direction x. Further, the second vertical section plane C-C and the third vertical section plane D-D cut through the semiconductor body 100 at different positions in the first lateral direction x.

Referring to FIGS. 1A-1D the temperature sensor TES includes a first semiconductor region 11 of a first doping type, a second semiconductor region 21 of a second doping type complementary to the first doping type, and a third semiconductor region 30 of the second doping type. The first semiconductor region 11 is arranged between the second semiconductor region 21 and the third semiconductor region 30 in the vertical direction z of the semiconductor body 100. The temperature sensor TES further includes a contact plug 4 that ohmically connects the first semiconductor region 11 and the second semiconductor region 21. "To ohmically connect" means that there is no rectifying junction in a current path from the first semiconductor region 11 via the contact plug 4 to the second semiconductor region 21, or vice versa. Thus, there is an ohmic contact between the contact plug 4 and each of the first semiconductor region 11 and the second semiconductor region 21. To achieve such ohmic contacts, the contact plug 4 may adjoin each of the first semiconductor region 11 and the second semiconductor region 21. Optionally, a contact region 11' (illustrated in dashed lines) of the same doping type as the first semiconductor region 11, but more highly doped than the first semiconductor region 11 is arranged between the contact plug 4 and the first semiconductor region 11. A doping concentration of the contact region 11' is high enough to achieve an ohmic contact between the contact plug 4 and the contact region 11', so that there is an ohmic connection between the contact plug 4 and the first semiconductor region 11. Equivalently, a contact region 21' (illustrated in dashed lines) that is of the second doping type and more highly doped than the second semiconductor region 21 may be arranged between the contact plug 4 and the second semiconductor region 21. A doping concentration on this contact region 21' is high enough to achieve an ohmic connection between the contact region 21' and the second semiconductor region 21.

The contact plug 4 includes a metal or a doped polycrystalline semiconductor material such as doped polysilicon. The metal includes, for example, platinum (Pt), aluminum (Al), copper (Cu), silver (Ag), titanium (Ti), or alloys including two or more of these metals. According to one example, the contact plug includes a layer stack including two or more of these metals and/or alloys.

The semiconductor body 100 includes a conventional semiconductor material such as silicon (Si), silicon carbide (SiC), gallium arsenide (GaAs), gallium nitride (GaN), or the like. According to one example, the first doping type is a p-type and the second doping type is a n-type. In a silicon based semiconductor body 100, for example, the first semiconductor region 11 may include boron (B) atoms as p-type doping atoms, and the second and third semiconductor regions 21, 30 may include at least one of phosphorous (P) atoms or arsenic (As) atoms as n-type doping atoms. In a silicon semiconductor body, a doping concentration of the optional contact regions 11', 21' is at least 1E18 cm$^{-3}$.

In the temperature sensor TES illustrated in FIGS. 1A-1D, the first semiconductor region 11, the second semiconductor region 21 and the third semiconductor region 30 form a bipolar transistor. More specifically, a section of the first semiconductor region 11 forms a base region of the bipolar transistor, the second semiconductor region 21 forms an emitter region of the bipolar transistor, and the third semiconductor region 30 forms a collector region of the bipolar transistor. The first, second and third regions 11, 21, 30 will therefore also be referred to as base, emitter and collector regions in the following.

The functionality of the temperature sensor TES and further features of the temperature sensor TES are explained with reference to FIG. 2. FIG. 2 shows the semiconductor body 100 in the first vertical section plane B-B in greater detail. Referring to FIG. 2, measuring a temperature of the semiconductor body 100 using the temperature sensor TES includes applying a measurement voltage $V_{CE}$ between the third semiconductor region (collector region) 30 and the contact plug 4, which is connected to the first region (base region) 11 and the second region (emitter region) 21. The contact plug 4 forms an emitter node E of the bipolar transistor, and the collector region 30 forms a collector node C or is connected to a collector node C.

A circuit symbol of the bipolar transistor formed by the first, second and third semiconductor regions 11, 21, 30 is also illustrated in FIG. 2. Just for the purpose of illustration it is assumed that the first doping type of the base region 11 is a p-type and the second doping type of the collector and emitter regions 30, 21 is an n-type so that the bipolar transistor is an n-p-n bipolar transistor.

The measurement voltage $V_{CE}$ is a DC voltage and, according to one example, is essentially constant. The measurement voltage is provided by a respective voltage source 71. Any type of DC voltage source can be used to generate the measurement voltage $V_{CE}$ between the collector node C, which is formed by the third semiconductor region 30, and the emitter node E. According to one example, the measurement voltage $V_{CE}$ is less than 5V, less than 2V, or even less than 1V. According to one example, the measurement voltage $V_{CE}$ is between 0.2V and 0.7V.

Figure 3:
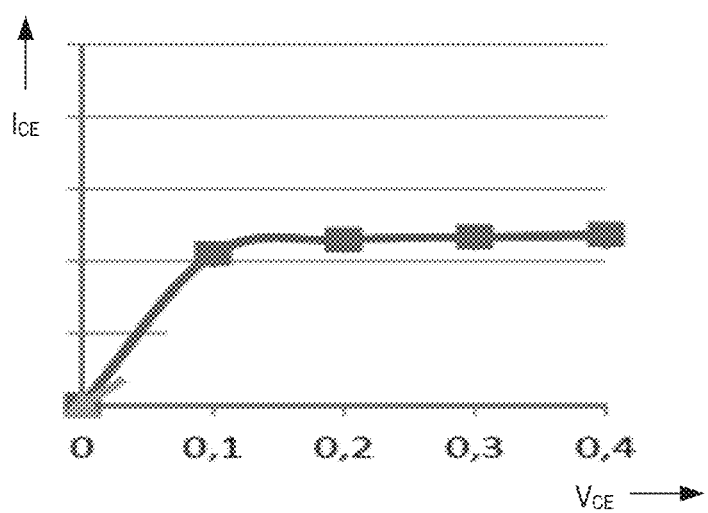
FIG. 3 illustrates a measurement current over a measurement voltage in a temperature sensor according to one example.

A rather low measurement voltage selected from between 0.2 V and 0.7 V is beneficial for various reasons. The measurement current $I_{CE}$ is not only dependent on the temperature, but is also dependent on the measurement voltage $V_{CE}$, wherein the dependency of the measurement current $I_{CE}$ on the measurement voltage $V_{CE}$ increases as the measurement voltage $V_{CE}$ increases. A high dependency of the measurement current $I_{CE}$ on the measurement voltage $V_{CE}$ has the effect that inadvertent variations of the measurement voltage $V_{CE}$ may cause variations of the measurement current $I_{CE}$, even if the temperature does not change. In a voltage range of the measurement voltage $V_{CE}$ of between 0.2V and 0.7V the dependency of the measurement current $I_{CE}$ on the measurement voltage $V_{CE}$ is rather low. This is illustrated in FIG. 3 which shows the measurement current $I_{CE}$ at a fixed temperature (180° C. in this example) dependent on the measurement voltage $V_{CE}$. As can be seen, in a range of between 0.1V and 0.4V the measurement current $I_{CE}$ is widely independent on the measurement voltage $V_{CE}$, wherein this range can be extrapolated to higher measurement voltages up to 0.7 V. Thus, when selecting the measurement voltage $V_{CE}$ from a range of between 0.2 V and 0.7 V variations of the measurement voltage $V_{CE}$ at the same temperature do not significantly affect the measurement current $I_{CE}$.

Further, when applying the measurement voltage $V_{CE}$ it takes some time for the temperature sensor to operate in a steady mode and, at a given temperature, provide a constant measurement current. The higher the measurement voltage $V_{CE}$ the longer this takes. Thus, when the measurement voltage $V_{CE}$ is rather low, such as being selected from between 0.2V and 0.7V, a reliable measurement current $I_{CE}$ will be provided faster than when using high measurement voltages $V_{CE}$.

The measurement voltage $V_{CE}$ causes a measurement current $I_{CE}$ to flow between the collector node C and the emitter node E of the bipolar transistor of the temperature sensor TES. This measurement current $I_{CE}$ is dependent on the temperature of the semiconductor body 100 in a region in which the temperature sensor TES is integrated, wherein the measurement current $I_{CE}$ increases as the temperature increases.

According to one example, a current sensor 72 is configured to measure the measurement current $I_{CE}$ and to provide a measurement signal $S_{ICE}$ that represents the measurement current $I_{CE}$ and, therefore, the temperature of the semiconductor body 100. Any type of current sensor 72 may be used to measure the measurement current $I_{CE}$ and provide the current measurement signal $S_{ICE}$. Examples of the current sensor 72 include, but are not restricted to, a Hall sensor, an inductive current sensor, a shunt resistor based current sensor, or the like.

A control circuit (not illustrated) may receive the measurement signal $S_{ICE}$ and output a signal that represents the temperature T associated with the measurement current $S_{ICE}$. The control circuit may be configured to obtain the temperature T based on the measurement current $S_{ICE}$ by at least one of the following: calculating the temperature T based on the measurement current $S_{ICE}$ using a predefined formula that reflects the relationship between the measurement current $S_{ICE}$ output by the temperature sensor TES and the associated temperature; obtaining a temperature value from a lookup table that includes a plurality of value pairs each including a measurement signal $S_{ICE}$ value and an associated temperature value.

As the contact plug 4 is ohmically connected to the base region 11, applying the measurement voltage $V_{CE}$ between the emitter node E and the collector node C is equivalent to applying the measurement voltage $V_{CE}$ across a p-n junction between the base region 11 and the collector region 30, wherein a polarity of the measurement voltage $V_{CE}$ is such that this p-n junction is reverse biased. Reverse biasing the p-n junction between the base region 11 and the collector region 30 causes a leakage current Ica to flow via the p-n junction from the collector region 30 to the base region 11. Charge carriers that cross the p-n junction from the collector region 30 to the base region 11 at positions spaced apart from the contact plug 4 in the first lateral direction x flow in the base region 11 in the lateral direction x towards the contact plug 4.

According to one example, a doping concentration of the emitter region 21 is much higher than a doping concentration of the base region 11 so that the electrical potential of the emitter region 21 can be considered to be essentially the same at each position of the emitter region 21 in the first lateral direction x, wherein this electrical potential equals the electrical potential of the contact plug 4. According to one example, a doping concentration of the emitter region 21 is between 1E18 cm$^{-3}$ and 1E21 cm$^{-3}$, for example.

In the first semiconductor region 11, however, the leakage current flowing in the lateral direction x causes a voltage drop such that in the first semiconductor region 11, the electrical potential increases as a distance to the contact plug 4 increases. The first semiconductor region 11 can be considered to include a base region section $11_1$ and a resistor section $11_2$. The base region section $11_1$ is a section of the first semiconductor region 11 that is spaced apart from the contact plug 4 in the first lateral direction x and forms a base region of the bipolar transistor. The resistor section $11_2$ is a section of the first semiconductor region 11 that is arranged between the base region section $11_1$ and the contact plug 4. This resistor section $11_2$ forms an ohmic resistance R for charge carriers entering the base region section $11_1$ via the reverse biased p-n junction and flowing in the first lateral direction x from the base region section $11_1$ via the resistor section to the contact plug 4.

An ohmic resistance of the resistor section $11_2$ between the base region section $11_1$ and the contact plug 4 is at least 1 MΩ. According to one example, the ohmic resistance is between 1 MΩ and 15 MΩ. According to one example, the ohmic resistance is higher than 3 MΩ or higher than 5 MΩ.

A resistor section of this type has the effect that even a small leakage current $I_{CB}$ from the collector region 30 to the base region section $11_2$ via the p-n junction causes a voltage drop $V_{BE}$ along the resistor section $11_2$ that is high enough to switch on the bipolar transistor, so that the measurement current $I_{CE}$ is significantly higher than the leakage current $I_{CB}$.

Figure 4:
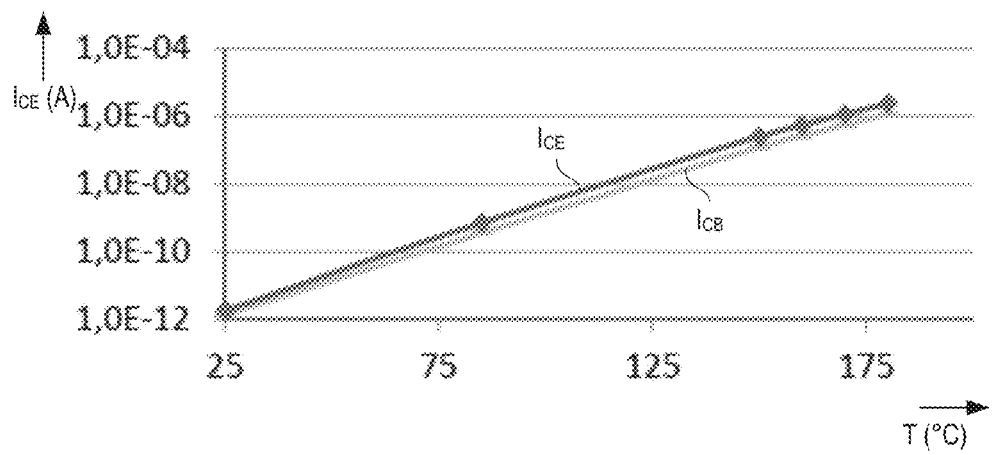
FIG. 4 illustrates a measurement current over a temperature in a temperature sensor according to one example.

The measurement current $I_{CE}$ of this kind of temperature sensor TES is exponentially dependent on the temperature T and increases as the temperature increases. FIG. 4 illustrates, on a logarithmic scale, the measurement current $I_{CE}$ of a temperature sensor according to one example dependent on the temperature T over a temperature range of between 25° C. and 175° C. In addition to the measurement current $I_{CE}$, the lower leakage current $I_{CB}$ is also illustrated in this example. An amplification factor α, which is the ratio between the leakage current $I_{CB}$ and the measurement current $I_{CE}$ can be adjusted by suitably selecting the parameters explained above, such as doping concentration of the base region 11, or the resistance of the resistor section $11_2$. In the example illustrated in FIG. 4, this amplification factor ($\alpha=I_{CE}/I_{CB}$) is about 2.

The curve illustrated in FIG. 4 shows the measurement current dependent on the temperature of a temperature sensor TES operated with a measurement voltage $V_{CE}$ of 0.4V, an Arsenic (As) doping concentration of the emitter region 12 of about 1E20 cm$^{-3}$, a boron (B) doping concentration of the base region 11 of about 1E17 cm$^{-3}$, and a resistance R of the resistance section $11_2$ of about 4 MΩ. These specific parameters, however, are only examples. These parameters may be varied in order to achieve a desired relationship between the measurement current $I_{CE}$ and the temperature T.

An exact relationship between the measurement current and the temperature is dependent on various parameters such as, for example, doping concentrations and dimensions of the first, second, and third semiconductor regions 11, 21, 30 and can either be calculated or obtained by measurements or simulations. In each case, however, the measurement current $I_{CE}$ increases as the temperature increases.

The ohmic resistance R of the base region section $11_2$ can be adjusted by suitably adjusting the following parameters of the resistor section $11_2$: a cross-sectional area A1 in a section plane perpendicular to the first lateral direction x, a length d1 in the first lateral direction x; and a doping concentration. According to one example, the doping concentration is essentially the same in the base region section $11_1$ and the resistor section $11_2$ and the base region section $11_1$ and the resistor section $11_2$ have the same cross-sectional area A1.

The cross-sectional area A1 of the resistor section $11_2$ is the area of the resistor section $11_2$ in a section plane extending in the second lateral direction y and the vertical direction z. A dimension w1 (see FIGS. 1C and 1D) of the first semiconductor region 11 and the resistor section $11_2$ is referred to as width w1 in the following, Further, a dimension h1 of the first semiconductor region 11 and the resistor section $11_2$ in the vertical direction z is referred to as height in the following. The cross-sectional area A1 is given by the width w1 multiplied with the height h1, $$A1 = w1 \cdot h1 \tag{1}.$$

According to one example, the cross-sectional area A1 is selected from between 3 square micrometres (μm$^2$) and 15 square micrometres. According to one example, the doping concentration of the first semiconductor region 11 is selected from between 1E16 cm$^{-3}$ and 1E18 cm$^{-3}$. According to one example, the first semiconductor region 11 is a boron (B) doped p-type layer. In this case, a doping concentration of between 1E16 cm$^{-3}$ and 1E18 cm$^{-3}$ is equivalent to a specific resistance of between 1.464 Ω·cm and 0.048 Ω·cm.

A doping concentration of 1E17 cm$^{-3}$, for example, corresponds to a specific resistance of about 0.206 Ω·cm.

According to one example, the doping concentration of the first semiconductor region 11 and the cross-sectional area A1 are adapted to one another such that a specific lateral resistance of the resistor section $11_2$ is between 3 kΩ/μm and 100 kΩ/μm. The specific lateral resistance is given by the cross-sectional area A1 multiplied with the respective specific resistance given by the doping concentration. The resistance R is then given by the specific lateral resistance multiplied with the length. A resistance R of the resistor region $11_2$ of 1 MΩ, for example, may be achieved by adjusting the specific lateral resistance such that is essentially equals 3 kΩ/μm and by making the resistor section $11_2$ longer than 333 micrometers (μm). A specific lateral resistance of 3 kΩ/μm can be achieved, for example, by adjusting the specific resistance (by suitably doping) to 1.2 Ω·cm and adjusting the cross-sectional area to 4 square micrometers (1.2 Ω·cm/4 μm$^2$=3 kΩ/μm).

It should be noted that the base region section $11_1$ is not necessarily distinguishable from the resistor section $11_2$ with regard to doping concentration, cross-sectional area, or specific lateral resistance. In the first semiconductor region 11, the base region section $11_1$ is a section that is spaced apart from the contact plug 4 by the resistor section $11_2$ (which is another section of the first region 11), wherein, as explained above, an ohmic resistance R of the resistor section $11_2$ between the base region section $11_1$ and the contact plug 4 is at least 1 MΩ. Referring to the above, the ohmic resistance R, at a given specific lateral resistance of the resistor section $11_2$, is associated with a certain length d1. An overall length of the resistor section $11_2$ and the base region $11_1$ section is therefore greater than d1. According to one example, a length of the base region section $11_1$ in the first lateral direction x is between 0.1 times and 2 times d1, in particular between 0.1 times and 0.5 times d1, so that the overall length of the resistor section $11_2$ and the base region section $11_1$ is between 1.1 times and 3 times d1, in in particular between 1.1 times and 1.5 times d1 in this example. Consequently, an overall resistance of the base region 11 in the base region section $11_1$ and the resistor section $11_2$ is between 1.1 times and 3 times the desired ohmic resistance R of the resistor section $11_2$, in particular between 1.1 times and 1.5 times the desired ohmic resistance R of the resistor section $11_2$. Referring to the above, the desired ohmic resistance R of the resistor section $11_2$ is between 1 MΩ and 15 MΩ, for example.

According to one example, the overall resistance of the base region 11 in the base region section $11_1$ and the resistor section $11_2$ is higher than 1.1 MΩ(=1.1×1 MΩ) higher than 3.3 MΩ(=1.1×3 MΩ), higher than 5.5 MΩ(=1.1×5 MΩ), or higher than 16.5 MΩ(=1.1×15 MΩ).

Figure 5:
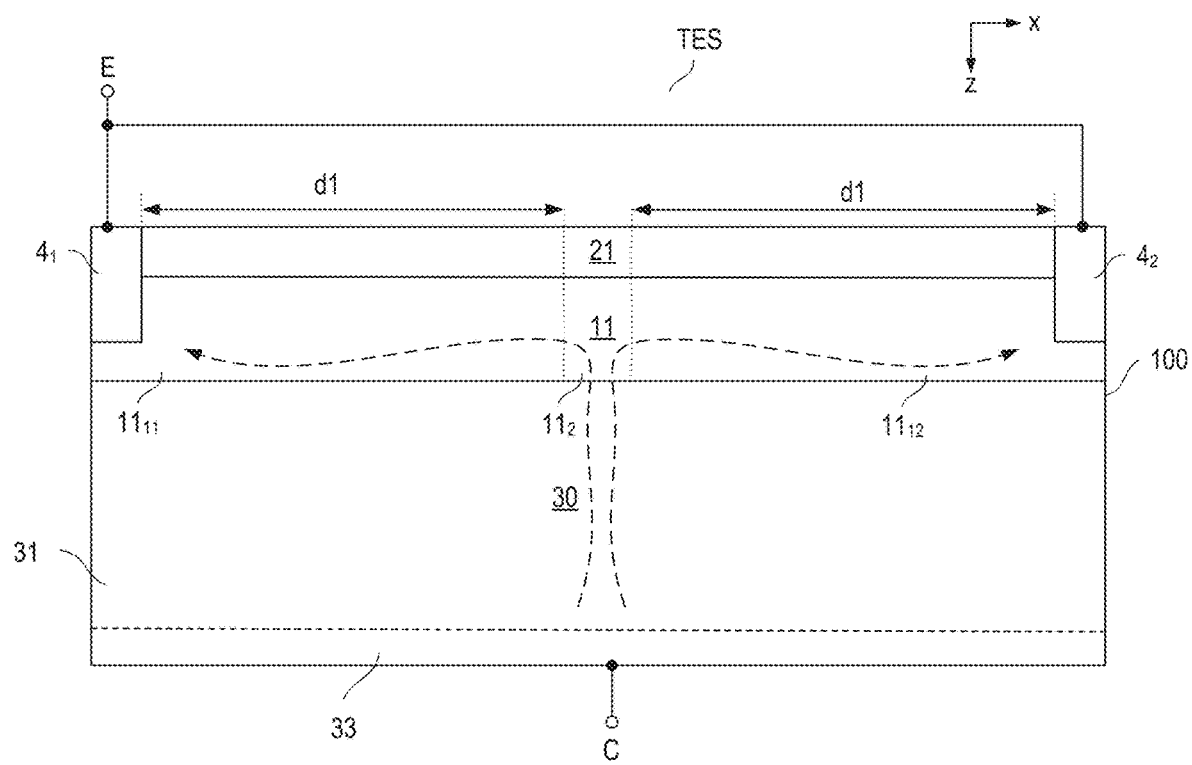
FIG. 5 illustrates a modification of the temperature sensor shown in FIGS. 1A-1D.

FIG. 5 shows a vertical cross-sectional view of a temperature sensor TES according to another example. In this example, the temperature sensor TES includes two contact plugs $4_1$, $4_2$ that are each ohmically connected to the first semiconductor region 11 and the second semiconductor region 21 and that are spaced apart from each other in the first lateral direction x. In this example, the temperature sensor TES includes a base region section $11_2$ between the two contact plugs $4_1$, $4_2$ and two resistor sections, a first resistor section $11_{11}$ arranged between a first one $4_1$ of the contact plugs $4_1$, $4_2$ and the base region section $11_2$, and a second resistor section $11_{12}$ arranged between a second one $4_2$ of the contact plugs $4_1$, $4_2$ and the base region section $11_2$. Everything explained with reference to FIG. 2 regarding a resistance, a doping concentration, and dimensions of the base region section $11_2$ and the resistor section $11_1$ applies to the base region section $11_2$ and the resistor sections $11_{11}$, $11_{12}$ illustrated in FIG. 5 accordingly.

Figure 6:
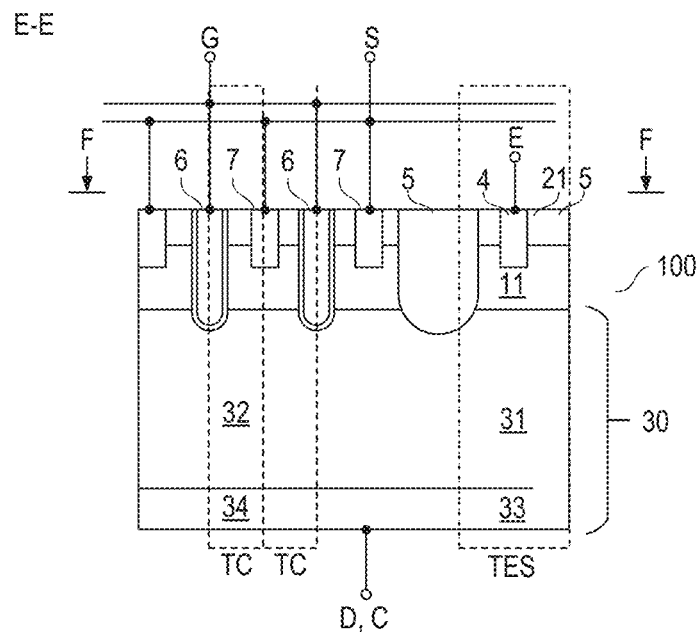
FIG. 6 shows a vertical cross-sectional view of one example of a semiconductor arrangement that includes a vertical transistor device with a plurality of transistor cells and a temperature sensor of the type shown in FIGS. 1A-1D.

According to one example, the temperature sensor TES is used to measure the temperature in a transistor device. In this example, the temperature sensor TES is integrated in the same semiconductor body 100 as the transistor device. A vertical cross-sectional view of a semiconductor body 100 in which the temperature sensor TES and a transistor device are integrated is illustrated in FIG. 6. In this example, the transistor device is a vertical transistor device, more specifically, a vertical power MOSFET and includes a plurality of transistor cells TC. One example of such transistor cell TC is illustrated in FIG. 7 in greater detail.

Figure 7:
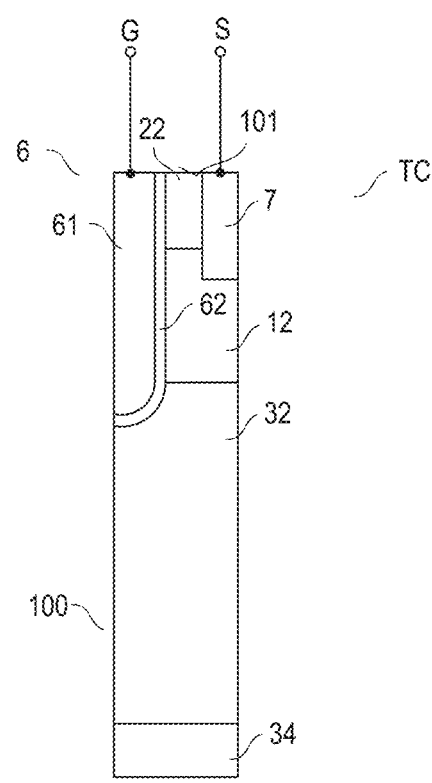
FIG. 7 shows a vertical cross-sectional view of a transistor cell according to one example in detail.

Referring to FIGS. 6 and 7, each transistor cell TC includes a body region 12 of the first doping type, a source region 22 of the second doping type, and a drift region 32 of the second doping type, wherein the body region 12 is arranged between the source region 22 and the drift region 32 in the vertical direction z of the semiconductor body 100. The transistor cell TC further includes a gate structure 6, wherein the gate structure includes an electrode 61 that is arranged adjacent the body region 12 and is dielectrically insulated from the body region 12 by a gate dielectric 62. In the example shown in FIGS. 6 and 7, the gate electrode 61 is arranged in a trench that extends from the first surface 101 into the semiconductor body. This, however, is only an example. According to another example (not shown) the gate electrode 61 is a planar gate electrode that is arranged on top of the first surface 101.

Referring to FIG. 7, each of the body region 12 and the source region 22 is connected to a source node S of the transistor device. For this, the body region 12 and the source region 22 may be connected to a source plug 7 that extends into the semiconductor body 100, wherein the source plug 7 is connected to a source node S. According to one example, the source plug 7 is ohmically connected to the source region 22 and the body region 12. For this, an optional contact region of the first doping type and more highly doped than the body region 12 may be arranged between the body region 12 and the source plug 7 in order to achieve an ohmic contact between the source plug 7 and the body region 12. Equivalently, a contact region of the second doping type and more highly doped than the source region 22 may be arranged between the source region 22 and the contact plug 7 in order to achieve an ohmic contact between the source plug 7 and the source region 22. Such contact regions, however, are not illustrated in 6 and 7. The source node S may be formed by a source metallization (not shown) that is formed on top of the first surface 101 and is connected to the source plugs 7.

Connecting the body region 12 and the source region 22 to the source node S via a contact plug 7 extending into the semiconductor body 100 is only an example. According to another example (not shown) a section of the body region 12 extends to the first surface 101 and the body region 12 and the source region 22 are connected to a source metallization formed on top of the first surface 101, wherein the source metallization forms the source node S or is connected to the source node S.

Referring to FIGS. 6 and 7, each transistor cell TC further includes a drain region 34 that is separated from the body region 12 by the drift region 32 and adjoins a second surface 102 opposite the first surface 101 of the semiconductor body 100. The drain region 34 is of the same doping type as the drift region 32, but has a higher doping concentration. A doping concentration of the drift region 32 is selected from between 1E13 cm$^{-3}$ and 1E17 cm$^{-3}$, for example, and doping concentration of the drain region 34 is selected from between 1E19 cm$^{-3}$ and 1E21 cm$^{-3}$, for example.

The drain region 34 may adjoin the drift region 32. According to another example (not illustrated) a buffer region of the first doping type is arranged between the drift region 32 and the drain region 34.

The transistor cells TC of the transistor device are connected in parallel in that the gate electrodes 61 of the individual transistor cells TC are connected to a common gate node G, the source and body regions 22, 12 of the transistor cells TC are connected to the common source node S, and the drain regions 34 of the transistor cells TC are connected to a common drain node D. The drift regions 32 of the individual transistor cells TC may be formed by one common semiconductor layer. Equivalently, the drain regions 34 of the transistor cells TC may be formed by one common semiconductor layer. The third semiconductor region 30 of the temperature sensor TES may be formed by a section of the semiconductor layer that forms the drift regions 32 and by a section of the semiconductor layer that forms the drain regions 34. In this case, the third semiconductor region 30 includes two partial regions, a first partial region 31 that has the same doping concentration as the drift regions 32 of the transistor cells TC, and a second partial region 33 that has the same doping concentration as the drain regions 34 of the transistor cells TC. The collector C of the temperature sensor TES is formed by the second partial region 33 in this example.

The first semiconductor region 11 of the temperature sensor TES may have the same doping concentration or doping profile as the body regions 12 of the transistor cells TC. In this case, the first semiconductor region 11 of the temperature sensor TES and the body regions 12 of the transistor cells TC may be formed by the same manufacturing process. Equivalently, the second semiconductor region 21 of the temperature sensor TES may have the same doping concentration or doping profile as the source regions 22 of the transistor cells TC. In this case, the second semiconductor region 21 of the temperature sensor TES and the source regions 22 of the transistor cells TC may be formed by the same manufacturing process. The "doping profile" is given by the doping concentration of the respective region 21, 22 at a respective position.

Figure 8:
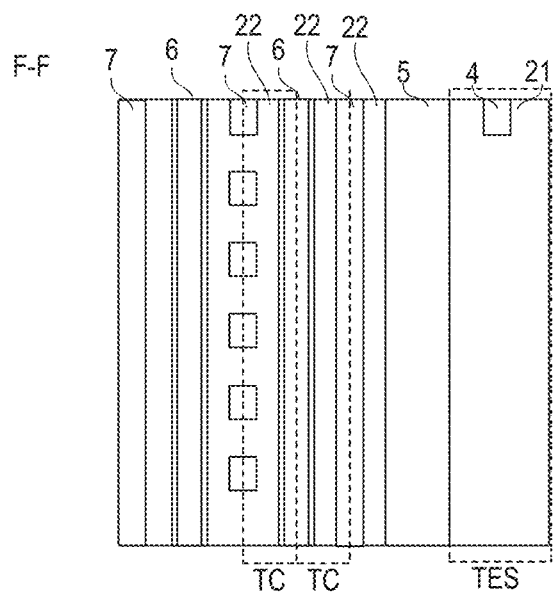
FIG. 8 shows a top view of the semiconductor arrangement shown 4.

FIG. 8 shows a top view of the arrangement shown in FIG. 6. In this example, the transistor cells TC are stripe cells (elongated transistor cells). That is, the transistor cells TC are elongated in the second lateral direction y. The contact plugs 7 may be elongated contact plugs, as illustrated in the case of one of the transistor cells TC shown in FIG. 8. Optionally, a plurality of contact plugs 7 may be arranged spaced apart from each other in the second lateral direction y as illustrated in the case of another transistor cell TC shown in FIG. 8. The temperature sensor TES may be implemented as explained with reference to FIGS. 1A-1D and 2 or as explained with reference to FIG. 5.

Figure 9:
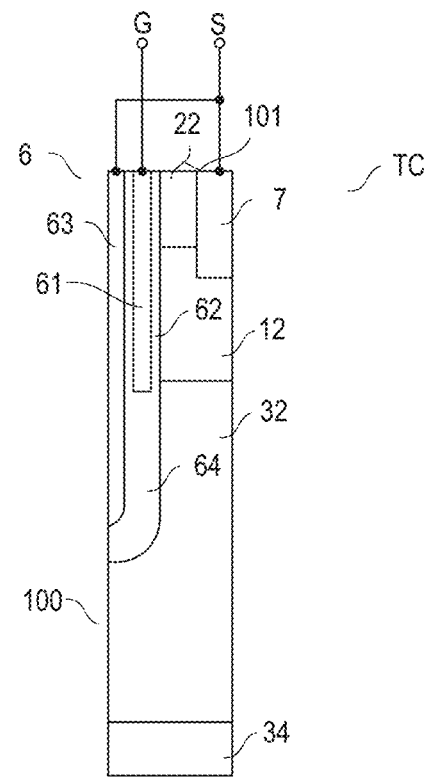
FIG. 9 shows a vertical cross-sectional view of a transistor cell according to another example in detail.

FIG. 9 shows a modification of the transistor cell TC shown in FIG. 7. In this example, the transistor cell TC further includes a field electrode 63 that is dielectrically insulated from the drift region 32 by a field electrode dielectric 64. The field electrode 63 may be connected to the source node S (as illustrated) or may be connected to the gate node G (not illustrated). The gate electrode 61 is dielectrically insulated from the field electrode 63.

Referring to FIG. 6, the first and second semiconductor regions 11, 21 of the temperature sensor TES are separated from source and body regions 22, 12 of the transistor cells TC by an isolation region 5. This isolation region 5 is configured to absorb a voltage that may occur between the source node S of the transistor device and the emitter node E of the temperature sensor TES when the transistor device and the temperature sensor TES are in operation. This is explained in the following.

The transistor device may be used as an electronic switch that switches on or off dependant on a voltage applied between the gate node G and the source node S. In the off-state of the transistor device a voltage between the source node S and the drain node D may reach a voltage level of several ten volts, or even several hundred volts, wherein this voltage is dependent on a voltage blocking capability transistor device. The "voltage blocking capability of the transistor device" is the maximum voltage the transistor device can withstand between the drain node D and the source node S.

Referring to FIG. 2, a constant voltage is applied between the collector node C of the temperature sensor TES and the emitter node E. The collector node C equals the drain node D of the transistor device so that a voltage $V_{SE}$ between the source node S and the emitter node E is given by the drain-source voltage $V_{DS}$ of the transistor device minus the voltage $V_{CE}$ between the collector node C and the emitter node E of the temperature sensor TES. Referring to the above, the measurement voltage $V_{CE}$ of the transistor device may be less than 5V and the voltage between the drain node D and the source node S of the transistor device may be several ten volts or several hundred volts, so that the voltage between the source node S and the emitter node E essentially equals the load path voltage $V_{DS}$ of the transistor device. The isolation region 5 is configured to withstand this voltage. Examples for implementing the isolation region 5 are explained herein further below.

Figure 10:
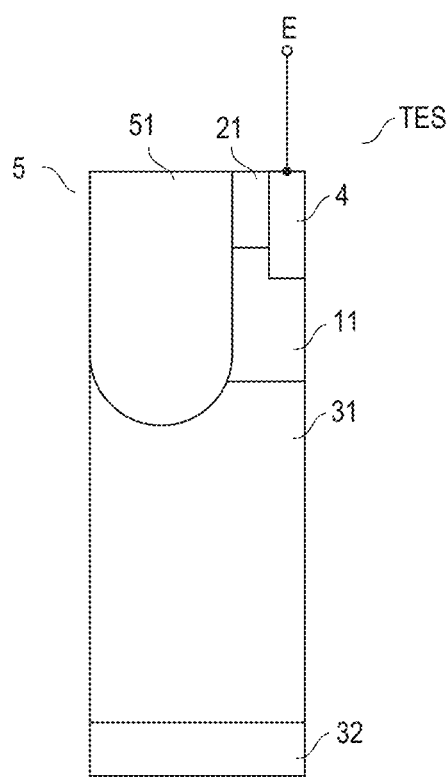
FIG. 10 shows a vertical cross-sectional view of an isolation between the temperature sensor and the transistor device according to one example.

FIG. 10 illustrates one example of the isolation region 5 and an adjoining section of the temperature sensor TES. In this example, the isolation region 5 includes a trench that extends from the first surface 101 into the semiconductor body 100 and adjoins the first and second semiconductor regions 21, 11 of the temperature sensor TES. The trench of the isolation region 5 extends into the semiconductor layer forming the drift region 32 of the transistor cells (not shown in FIG. 10) and the first partial region 31 of the collector region 30 of the temperature sensor TES. This trench includes an electrically insulating material. This material may be a solid such as an oxide, a nitride, or the like. Alternatively, the trench is at least partially filled with a gas such as air, a noble gas, or the like.

Figure 11:
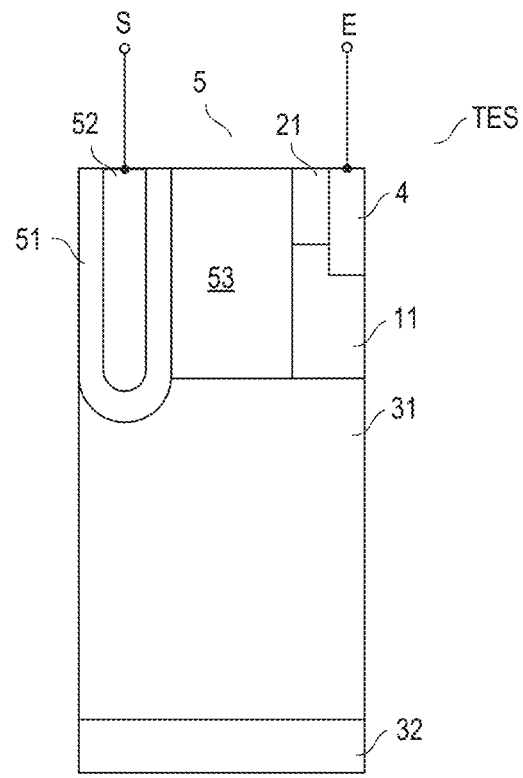
FIG. 11 shows a vertical cross-sectional view of the isolation according to another example.

Another example of the isolation region 5 is illustrated in FIG. 11. In this example, the isolation region includes a trench that is spaced apart from the first and second regions 11, 21 of the temperature sensor TES in the first lateral direction x. Further, this trench includes an electrode 52 that is dielectrically insulated from the semiconductor body 100 by an insulator. The insulator 51 is an oxide or a nitride, for example. The electrode 52 may be connected to the source node S. Referring to FIG. 11, the isolation region 5 further include a doped region 53 of the first doping type arranged between the trench and the first and second regions 11, 21 of the temperature sensor TES. This doped region 53 may have the same doping concentration as the first region 11 of the temperature sensor TES, for example.

Figure 12:
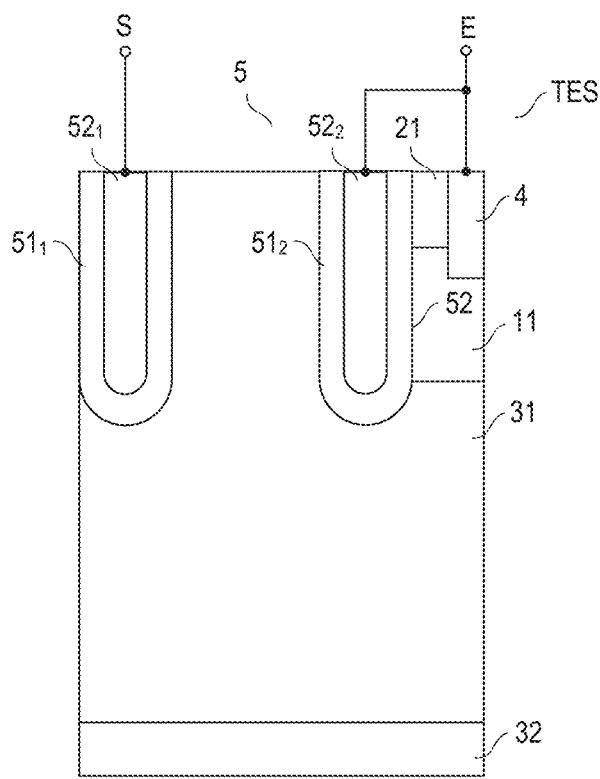
FIG. 12 shows a vertical cross-sectional view of the isolation according to yet another example.

FIG. 12 illustrates a modification of the isolation region 5 shown in FIG. 12. In this example, the isolation region 5 includes two trenches, a first trench with a first electrode $52_1$ and a first dielectric $51_1$ that is spaced apart from the temperature sensor TES. The electrode $52_1$ is connected to the source node S. This trench is equivalent to the trench illustrated in FIG. 11.

Referring to FIG. 12, the isolation region 5 further includes a second trench with a second electrode $52_2$ that is dielectrically insulated from the semiconductor body 100 by a second dielectric $51_2$. This second trench adjoins the first and second regions 11, 21 of the temperature sensor TES. The electrode $52_2$ is connected to the emitter node E, for example. Referring to FIG. 12, a section of the semiconductor layer forming the drift region 32 of the transistor cells TC and the first partial region 31 of the collector region 30 of the temperature sensor TES may extend to the first surface 101 of the semiconductor body 100 between the two trenches.

Figure 13:
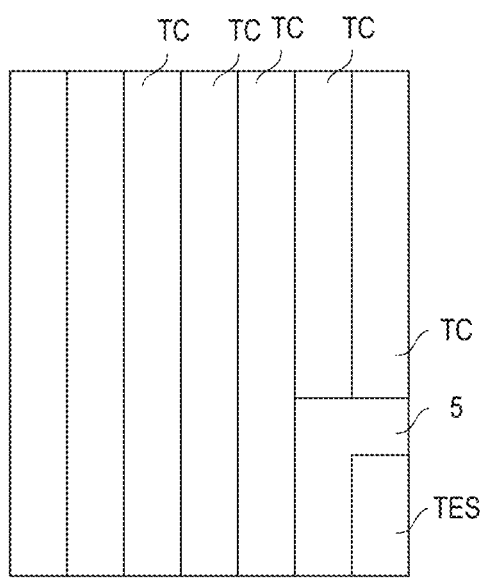
FIG. 13 shows a top view of the semiconductor arrangement according to one example.

FIG. 13 schematically illustrates a top view of an arrangement with the temperature sensor TES and the transistor device. The arrangement with the transistor cells TC is referred to as transistor cell array in the following. In the example shown in FIG. 13, the temperature sensor TES is arranged in a corner of the transistor cell array and separated from the transistor cells TC of the cell array by the isolation region 5.

Figure 14:
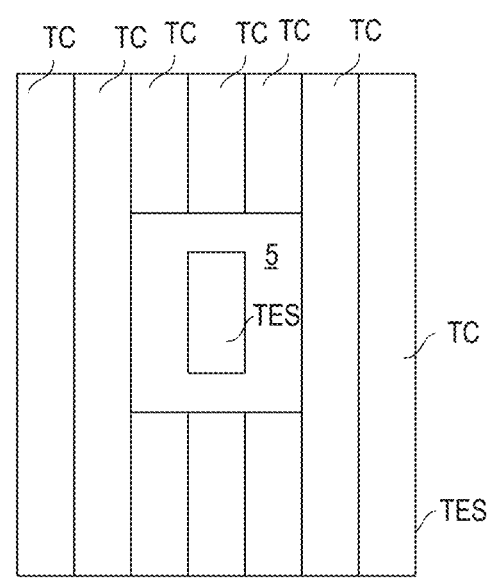
FIG. 14 shows a top view of the semiconductor arrangement according to another example.

According to another example shown in FIG. 14, the temperature sensor TES is surrounded by the transistor cells TC of the cell array and separated from the transistor cells TC by the isolation region 5.

Referring to the above, a control circuit (not illustrated) may receive the current measurement signal $S_{ICE}$ provided by the temperature sensor TES. In the examples illustrated in FIG. 4 et seq. in which the temperature sensor TES and a transistor device are integrated in the same semiconductor body 100, the control circuit may be configured to switch off the transistor when the current measurement signal $S_{ICE}$ indicates that the temperature in the semiconductor body has reached a predefined temperature threshold. In this case, the control circuit may simply compare the current measurement signal $S_{ICE}$ with a value that represents the temperature threshold in order to decide whether to switch off the transistor device or not.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement, comprising:
a semiconductor body; and
a temperature sensor integrated in the semiconductor body,
wherein the temperature sensor comprises:
a first semiconductor region of a first doping type arranged, in a vertical direction of the semiconductor body, between a second semiconductor region of a second doping type and a third semiconductor region of the second doping type; and
a contact plug ohmically connecting the first semiconductor region and the second semiconductor region,
wherein the first semiconductor region comprises a base region section spaced apart from the contact plug in a first lateral direction of the semiconductor body and a resistor section arranged between the base region section and the contact plug, and
wherein the resistor section is implemented such that an ohmic resistance of the resistor section between the base region section and the contact plug is at least 1 MΩ.

2. The semiconductor arrangement of claim 1, wherein the ohmic resistance of the resistor section between the base region section and the first semiconductor region is between 1 MΩ and 15 MΩ.

3. The semiconductor arrangement of claim 1, wherein the ohmic resistance of the resistor section between the base region section and the first semiconductor region is higher than 3 MΩ or higher than 5 MΩ.

4. The semiconductor arrangement of claim 1, wherein a specific lateral resistance of the resistor region essentially equals a specific lateral resistance of the base region section.

5. The semiconductor arrangement of claim 4, wherein the specific lateral resistance of the resistor region and the base region section is between 3 kΩ/μm and 100 kΩ/μm, between 3 kΩ/μm and 50 kΩ/μm, or between 3 kΩ/μm and 30 kΩ/μm.

6. The semiconductor arrangement of claim 1, wherein a doping concentration of the first semiconductor region is between $1E16$ cm$^{-3}$ and $1E18$ cm$^{-3}$.

7. The semiconductor arrangement of claim 1, wherein a cross-sectional area of the first semiconductor region in a plane perpendicular to the first lateral direction is between 3 and 15 square micrometers.

8. The semiconductor arrangement of claim 1, wherein a doping profile of the resistor section in the vertical direction and a second lateral direction perpendicular to the first lateral direction essentially equals a doping profile of the base region section in the vertical direction and the second lateral direction.

9. The semiconductor arrangement of claim 1, wherein a length of the resistor region in the first lateral direction is at least 200 μm.

10. The semiconductor arrangement of claim 1, further comprising a plurality of transistor cells integrated in the semiconductor body, wherein each of the plurality of transistor cells comprises:
a body region of the first doping type arranged, in the vertical direction of the semiconductor body, between a source region of the second doping type and a drift and drain regions of the first doping type; and
a gate electrode dielectrically insulated from the body region by a gate dielectric.

11. The semiconductor arrangement of claim 10, wherein the drift and drain regions of each of the plurality of transistor cells and the third semiconductor region of the temperature sensor are connected to a common circuit node.

12. The semiconductor arrangement of claim 11, wherein the drift and drain regions of each of the plurality of transistor cells and the third semiconductor region of the temperature sensor are formed by at least one common semiconductor layer.

13. The semiconductor arrangement of claim 11, wherein the source regions of each of the plurality of transistor cells are connected to a common source node, and wherein the contact plug of the temperature sensor is connected to a circuit node different from the common source node.

14. The semiconductor arrangement of claim 10, wherein an isolating arrangement is located between the body and source regions of each of the plurality of transistor cells and the first and second semiconductor regions of the temperature sensor.

15. The semiconductor arrangement of claim 14, wherein the isolating arrangement comprises at least one trench that is at least partially filled with an isolating material.

16. The semiconductor arrangement of claim 15, wherein the at least one trench comprises:
- a first trench adjoining the body region of at least one transistor cell and having covered at least its surface with a first isolating layer; and
- a second trench adjoining the first semiconductor region of at least one transistor cell and having covered at least its surface with a second isolating layer.

17. The semiconductor arrangement of claim 15, wherein the isolating arrangement further comprises at least one of:
- a first electrode arranged in the first trench, separated from the semiconductor body by the first isolating layer, and connected to the common source node; and
- a second electrode arranged in the second trench, separated from the semiconductor body by the second isolating layer, and connected to the second semiconductor region.

18. The semiconductor arrangement of claim 1, further comprising:
- a voltage source connected between the contact plug and the third semiconductor region; and
- a current sensor configured to sense a current through the temperature sensor.

19. The semiconductor arrangement of claim 18, wherein the third semiconductor region comprises a first partial region adjoining the first semiconductor region and a second partial region, wherein the first partial region is arranged between the first semiconductor region and the second partial region, wherein the second partial region is electrically connected to the first partial region, and wherein the voltage source is connected to the second partial region.

20. The semiconductor arrangement of claim 1, further comprising:
- a further contact plug ohmically connecting the first semiconductor region and the second semiconductor region and spaced apart from the contact plug in the first lateral direction.

21. A method for forming a temperature sensor in a semiconductor body, the method comprising:
- forming a first semiconductor region of a first doping type, a second semiconductor region of a second doping type, and a third semiconductor region of the second doping type in the semiconductor body such that the first semiconductor region, in a vertical direction of the semiconductor body, is arranged between the second semiconductor region and the third semiconductor region; and
- forming a contact plug ohmically connecting the first semiconductor region and the second semiconductor region,
- wherein forming the first semiconductor region comprises forming the first semiconductor region such that the first semiconductor region comprises: a base region section spaced apart from the contact plug in a first lateral direction of the semiconductor body, and a resistor section arranged between the base region section and the contact plug,
- wherein an ohmic resistance of the resistor section between the base region section and the contact plug is at least 1 MΩ.

22. A method for measuring a temperature in a semiconductor body using a temperature sensor that includes a temperature sensor integrated in a semiconductor body, the temperature sensor comprising a first semiconductor region of a first doping type arranged, in a vertical direction of the semiconductor body, between a second semiconductor region of a second doping type and a third semiconductor region of the second doping type, and a contact plug ohmically connecting the first semiconductor region and the second semiconductor region, wherein the first semiconductor region comprises a base region section spaced apart from the contact plug in a first lateral direction of the semiconductor body and a resistor section arranged between the base region section and the contact plug, and wherein the resistor section is implemented such that an ohmic resistance of the resistor section between the base region section and the contact plug is at least 1 MΩ, the method comprising:
- applying a measurement voltage between the third semiconductor region and the contact plug; and
- measuring a current flowing between the third semiconductor region and the contact plug.

23. The method of claim 22, wherein the measurement voltage is between 0.2 V and 0.7 V.

* * * * *